(12) United States Patent
Gmyr et al.

(10) Patent No.: US 9,734,771 B2
(45) Date of Patent: Aug. 15, 2017

(54) TOUCH-SENSITIVE FLAT-PANEL CONTROL AND INTERFACE

(71) Applicants: Hollis J Gmyr, Liverpool, NY (US); Weidong Pan, Morganville, NJ (US); James H Ritchie, Pennellville, NY (US); Eric Christopher Wood, East Syracuse, NY (US); Andrew S Kadah, Manlius, NY (US)

(72) Inventors: Hollis J Gmyr, Liverpool, NY (US); Weidong Pan, Morganville, NJ (US); James H Ritchie, Pennellville, NY (US); Eric Christopher Wood, East Syracuse, NY (US); Andrew S Kadah, Manlius, NY (US)

(73) Assignee: International Controls and Measurements Corp., North Syracuse, NY (US)

( * ) Notice: Subject to any disclaimer, the term of this patent is extended or adjusted under 35 U.S.C. 154(b) by 155 days.

(21) Appl. No.: 14/686,189

(22) Filed: Apr. 14, 2015

(65) Prior Publication Data
US 2016/0306482 A1    Oct. 20, 2016

(51) Int. Cl.
*G09G 3/36* (2006.01)
*G06F 3/044* (2006.01)
*G05D 23/19* (2006.01)
(Continued)

(52) U.S. Cl.
CPC ............... *G09G 3/36* (2013.01); *G05D 23/19* (2013.01); *G06F 1/3265* (2013.01);
(Continued)

(58) Field of Classification Search
CPC ...... G06F 3/0416; G06F 3/0412; G06F 3/044; G06F 3/36; G06F 2203/04103;
(Continued)

(56) References Cited

U.S. PATENT DOCUMENTS 5,809,942 A    9/1998   Kralovec et al.
6,857,967 B2   2/2005   Loyd et al.
(Continued)

*Primary Examiner* — Lisa Landis
(74) *Attorney, Agent, or Firm* — Bernhard P. Molldrem, Jr.

(57) ABSTRACT

A touch-screen control panel interface has a dielectric flat or curved front panel and a printed circuit board with a front side and a reverse side which is the component side. Alphanumeric display module(s) or an LCD display and optional protective cap mounted on the reverse side of the circuit board are visible through window cutout(s) on the board. An array of LED indicators can be mounted on the back side of the circuit board and visible through cutouts in the board. Metallized capacitive pads on or adjacent the back side of the front panel at touch locations permit selection of various modes, functions, and settings. These pads may be formed on the flat front side of the circuit board, on the back of the front plate, or on an intermediate membrane. A microprocessor is connected with the various components and with capacitive pad. Icons may be printed onto the flat panel, in registry with the metallized capacitive electrode pads. A potting dam is formed of a back plate configured to adhere to the front panel and an open frame extending rearwards. Synthetic resin potting material fills the frame and hermetically seals the circuit board. Positions of the capacitive touch pads can be illuminated when active, as a guide for the user or operator. A second circuit board may be positioned in the frame directly proximal of the first circuit board, and optionally encapsulated.

13 Claims, 14 Drawing Sheets

(51) Int. Cl.
*G06F 1/32* (2006.01)
*H03K 17/96* (2006.01)

(52) U.S. Cl.
CPC ............... *H03K 17/9622* (2013.01); *H03K 2217/94052* (2013.01); *H03K 2217/96076* (2013.01); *H03K 2217/960755* (2013.01); *H03K 2217/960785* (2013.01)

(58) Field of Classification Search
CPC ............ G06F 2203/04112; G06F 2203/04804; G06F 1/16–1/1698
See application file for complete search history.

(56) References Cited

U.S. PATENT DOCUMENTS

| | | |
|---|---|---|
| 6,880,547 B2 | 4/2005 | Bilodeau |
| 2004/0239642 A1 | 12/2004 | Shi et al. |
| 2006/0132453 A1 | 6/2006 | Boyd et al. |
| 2007/0257893 A1 | 11/2007 | Philipp et al. |
| 2008/0141449 A1 | 6/2008 | Ren |
| 2013/0342970 A1* | 12/2013 | Franklin ............... G06F 1/1643 361/679.01 |
| 2014/0184937 A1* | 7/2014 | Lim ...................... H01L 27/323 349/12 |
| 2014/0277777 A1 | 9/2014 | Potucek |
| 2014/0293145 A1* | 10/2014 | Jones ................... G06F 1/1626 349/12 |
| 2015/0261332 A1* | 9/2015 | Nakamura ............ G06F 3/0412 345/173 |
| 2016/0120028 A1* | 4/2016 | Bach ................... H05K 1/0274 345/174 |

\* cited by examiner

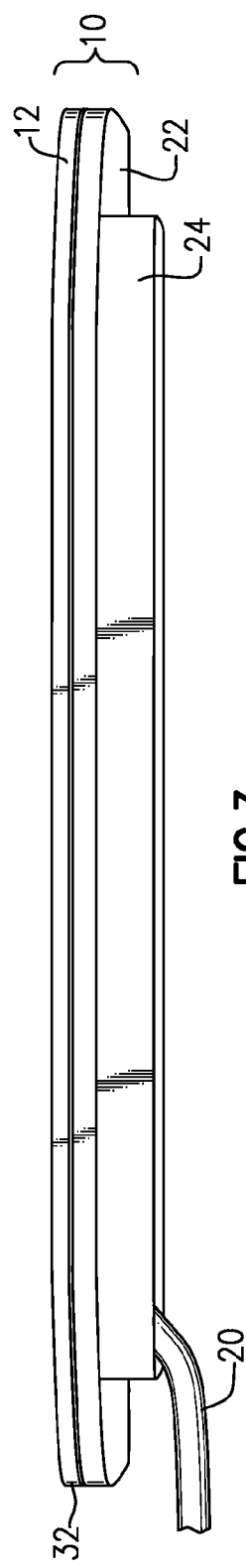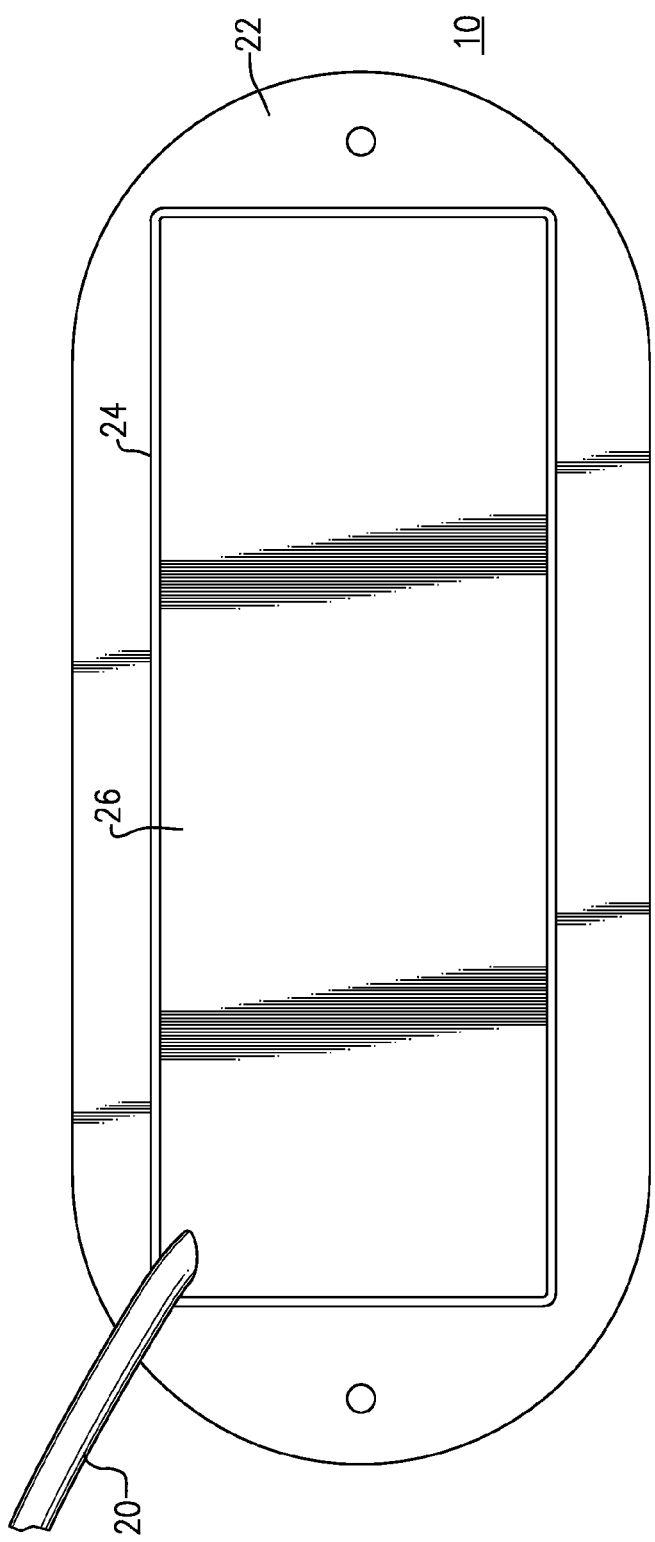

TOUCH-SENSITIVE FLAT-PANEL CONTROL AND INTERFACE

BACKGROUND OF THE INVENTION

The present invention relates to control panels for controlling apparatus or appliances of various types, and is more particularly concerned with control panels that are touch sensitive. The invention is more specifically directed to touch-sensitive control panels that are made substantially rigid and avoid mechanical switch elements.

The invention is also concerned with a control panel that is provided with a generally flat rigid or semi-rigid front panel or plate, and which has capacitive touch sensor pads behind the front panel, and which can be hermetically sealed for use in harsh environments.

Touch sensors are an attractive choice in many environments because they require no moving parts, and the surface presented to the user can be a plain, smooth surface which can be sealed to prevent moisture, dust, and contaminates from entering and compromising the control panel, and which can be easily cleaned. Also the touch sensors may be made transparent or translucent, at least in part, which permits them to be back-lit, e.g., with LEDs, to assist or guide the user or operator when employing the touch panel to set or operate the associated equipment.

One example of an application for a control panel where a capacitive touch screen can provide an advantage is in a controller for pool-and-spa equipment such as a water heater or heater and chiller, where the controls are or may be exposed to moisture and caustic chemicals. These control panels are typically mounted on the shell or housing of a pool water heater or pool-and-spa water heater, which may also include pump and filtration equipment. This equipment may be in the form of a heat pump which can be configured for cooling as well as heating the water for the pool and/or spa. At a minimum, this would require the controls to switch between modes for heating and cooling, and to allow the operator to adjust the heating and possibly cooling setpoints for the pool and for the spa or hot-tub.

The control panel also includes a display, visible through a transparent window zone of the front panel, that can show the water temperature, the programmed temperature setpoint(s), and indications of the mode and of which features are active and can be selected and changed.

The capacitive touch-screen control panel can be employed in many other applications as well, for example, in adjusting the height of a work space desk or work surface in an emergency work station.

Favorably the panel front plate is a simple rigid, impervious plate of a durable material, such as an acrylic, a polycarbonate, or glass, for example, which is robust and can be suitably transparent, and which has a sufficiently high dielectric constant so that the capacitive electrode pads will pick up the presence of an operator's finger when placed on the front surface of the panel front plate.

Previous control panels typically employ a touch screen keypad with one or more rows of membrane switches for select, mode, temperature increment up, and temperature increment down functions. The membrane switch keypad is adhered to the rigid plastic front plate, and an associated printed circuit board is mounted inside the cabinet behind the board. The printed circuit board is then connected by a cable to the pool heater or pool heat pump equipment. In these arrangements LED alpha-numeric display modules are mounted on the printed circuit board and are visible through a window on the front panel or plate. These alpha-numeric display modules have to be mounted on the front or facing side of the board and electrically connected with conductive traces on that side of the board. Consequently, the board has to be spaced or offset behind the front plate to provide clearance for the display modules and also for a number of LED indicators that are also visible through the window of the front plate to indicate modes and settings.

The membrane switches have a limited life span, and can crack and leak, leading to switch failures.

OBJECTS AND SUMMARY OF THE INVENTION

Thus, it is an object of this invention to provide a durable and reliable touch screen control panel that avoids the drawbacks of the prior art.

It is a more specific object to provide a touch screen control panel that is simple to use and operate, and which can be made highly resistant to caustic elements and contaminants in the environment in which it is used.

It is a further object to produce a touch screen control panel that is of simple design, inexpensive to manufacture and install.

According to an aspect of the present invention, a touch-screen control panel interface is formed with a generally flat front panel made of a plate of rigid dielectric material, e.g., acrylic or other clear or translucent plastic resin, having a front face and a back face, and which has a transparent window portion. The front panel may be completely flat, or may be gently curved on one or more axes, and may be glass or another suitable dielectric. The window position may be an unpainted or unprinted area in the panel, suitably transparent so as to permit reading a display device behind the panel. An associated circuit board has a flat front side and a reverse side. In other embodiments, the circuit board may be somewhat curved to match the front panel. The circuit board includes at least one numeric or alphanumeric display module mounted on the reverse side of the circuit board, and having a visible display on the front face thereof. In the illustrated embodiment, there are three of these display modules, but in some applications more or fewer may be used. This may alternatively be embodied as an LCD device, such as e.g. an E-Ink display of the type used in some E-readers. The circuit board has a window cutout at the position where the at least one numeric or alphanumeric display is mounted, and the display module(s) are oriented with their front face towards the circuit board such that its visible display is situated within the window cutout, and are viewed at the front side of the circuit board. The electrodes or connectors of the display module(s) are then soldered or otherwise connected to conductor traces on the upper or back side of the board. An array of LED indicators can be mounted on the back side of the circuit board at predetermined LED locations, usually adjacent or nearly adjacent to the display module or modules. The printed circuit board has apertures through the board formed at these LED locations such that when each indicator LED is energized, the associated LED indicator emits light through the respective apertures to be visible at the front side of the circuit board and through a window portion of the front panel. As a means for actuating the capacitive touch feature, there is an array of metallized capacitive electrode pads formed at predetermined respective locations on the flat front side of the circuit board. In other embodiments, these electrode pads may be formed, e.g., screened or printed, directly on the front panel, or on a thin intermediate membrane. When the arrangement is completely assembled, these electrode pads are positioned adjacent or upon the back side of the front panel at the touch locations for the various modes, functions, and settings needed. A microprocessor is mounted on the back side of the circuit board and has input electrodes and output electrodes. An array of traces and other conductors on the circuit board connect input electrodes and output electrodes of the microprocessor to the numeric or alphanumeric display module(s), to the LED indicators, and to the array of metallized capacitive electrode pads. A multi-conductor cable connects with the array of conductors and extends from the circuit board to connect the control panel with the apparatus that it controls, such as a pool-and-spa heater or heating and cooling system.

An adhesive member, e.g., a layer of a suitable non-conducting glue, is sandwiched between the circuit board and the flat panel such that the flat front side of the circuit board is positioned substantially directly upon the back face of the flat panel and affixed securely to it.

Favorably, touch button icons are printed onto the back surface of the flat panel, and are configured to align in registry with the metallized capacitive electrode pads on the circuit board.

For use in a more severe environment, i.e., where there may be contaminates or caustic chemicals present, the touch screen control panel can further include a back plate dimensioned and configured to be adhered to the front panel. The back plate favorably has a cutout so dimensioned as to fit around the circuit board when the circuit board is adhered to the front flat panel. A frame extends rearward at the periphery of the cutout on the back plate, and serves as a dam or barrier for potting compound. An encapsulation of a synthetic resin potting material fills the frame and hermetically seals the circuit board within the touch screen control panel interface. This construction helps protect the components from other harsh environments, protecting against such factors as vibration, ultraviolet light, heat, cold, and arid or humid climates.

In a variation or alternative embodiment, the positions of the capacitive touch pads can be illuminated when active, as a guide for the user or operator. In such case, there can be LEDs positioned on the back or rear side of said circuit board at locations in registry with the respective capacitive electrode pads, and with the board and said capacitive electrode pads being at least partly translucent or transparent at the locations of these LEDs. The microprocessor is operative to illuminate the respective LEDs when the associated touch-screen control panel interface is in an active condition and to hold the LEDs off when the touch-screen control panel interface is in an inactive condition.

In one favorable arrangement, the array of metallized capacitive electrode pads are arranged in a row on the circuit board. The microprocessor is suitably programmed to switch the touch screen control panel interface into an inactive condition after a predetermined time of inactivity, and to switch the touch screen control panel interface into an active condition when the microprocessor detects that the capacitance on said electrode pads has changed, in row order, to indicate a swipe past the row of said capacitive electrode pads. This feature will avoid having the control panel accidentally change the mode of operation or the settings of associated equipment, such as from having a bird or squirrel land on the control panel at the location of one or more of the capacitive electrode pads, or from falling water such as rainfall or hose spray landing on the control panel.

The array of metallized capacitive electrode pads can be arranged in any convenient predetermined pattern on the circuit board and said microprocessor is suitably programmed to switch the touch screen control panel interface into an inactive condition after a predetermined time of inactivity, and to switch the touch screen control panel interface into an active condition when the microprocessor detects that the capacitance on the electrode pads has changed in a predetermined order of the pattern of the capacitive electrode pads.

The capacitive electrode pads can be metallized, e.g., by using a silver screen-printed ink, a nano-silver ink jet, a nano-copper screen-printed ink, or a nano-copper ink jet, for example, and printed on the forward surface of the printed circuit board, or on the back surface of the front plate, or on an intermediate membrane.

In some embodiments, the construction can employ stacked printed circuit boards, in which a first printed circuit board is adhered to the front plate or panel, and then is encapsulated by filling it with a suitable potting resin. Where the application employs an LCD module as the display device, a cap or cover is adhered onto the module prior to potting as a protective cap so as to keep the resin out. A second printed circuit board is stacked within the potting frame and is interconnected with the first printed circuit board using a board-to-board connector. Once the second board is in place resin is flowed in to encapsulate the second board as well. Channels on the side walls of the potting barrier may be used for flowing in the potting resin. This construction is not limited only to two stacked boards; rather, any number of boards may be stacked and (optionally) potted, in parallel or perpendicular orientation.

The above and other features and advantages of the touch screen control panel of the present invention can be appreciated from the ensuing detailed description of selected preferred embodiments, which is to be read in connection with the accompanying Figures of Drawing.

BRIEF DESCRIPTION OF THE DRAWING

FIG. 3 is a side view or edge view thereof.

FIG. 4 is back view thereof.

DETAILED DESCRIPTION OF A PREFERRED EMBODIMENT

Figure 1:
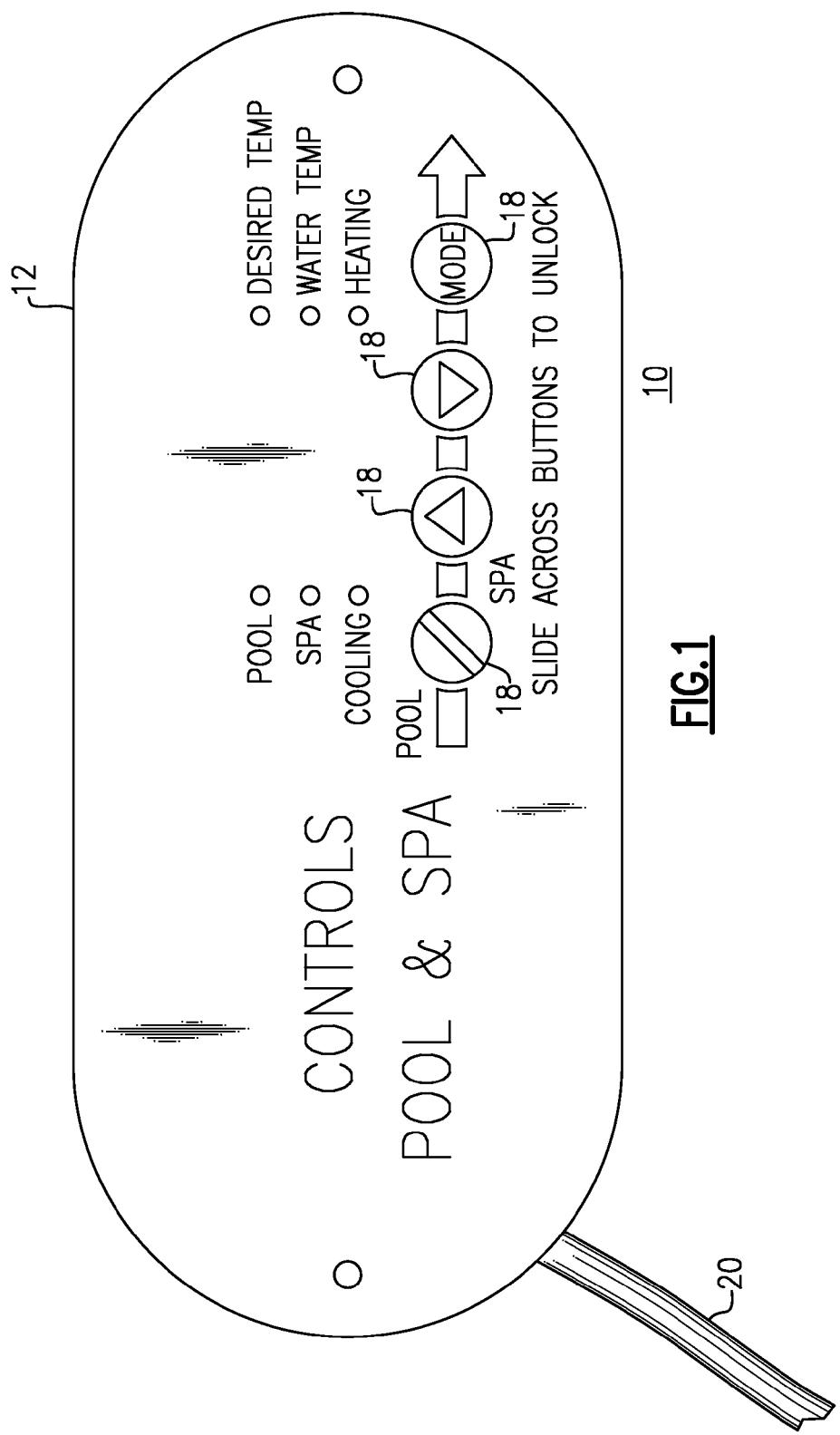
FIG. 1 is a front view of the touch screen control panel according to one illustrative embodiment of this invention.

With reference to the Drawing and initially to FIG. 1, a hermetically sealed capacitive touch screen control panel 10 is designed for a pool and spa application to control a water heater and cooler for controlling temperature of both a backyard or indoor swim pool and a spa or hot tub. Typically, the control panel fits into a receptacle in the housing or cover of the water heater or heat pump equipment, which may also include filter(s) and pump. In this embodiment there is a front panel 12 which is a sheet or plate of a clear acrylic, with graphics painted or applied onto a rear surface. As illustrated here, the graphics can include a series or row of round touch button icons 18, each indicating the position of a capacitive electrode located at the reverse side of the front panel 12. In this example, there are four icons 18, for pool/spa select, raise temperature, lower temperature, and mode select. There is also an arrow design and instructions for swiping across the four icons 18 to unlock or "wake up" the control, which will be discussed later. The icons appear here as circles or disks, but these could be any arbitrary shape. In some cases, the front panel 12 could be a blank front or plain face, without any clear marking of icons, but illumination behind the front panel 12 could indicate the positions of the icons and which one or ones were active for a given mode.

A multi-conductor cord or cable 20 extends from behind the control panel 10 and connects to a control board (not shown) for the water heater or heat pump equipment within the housing.

Figure 2:
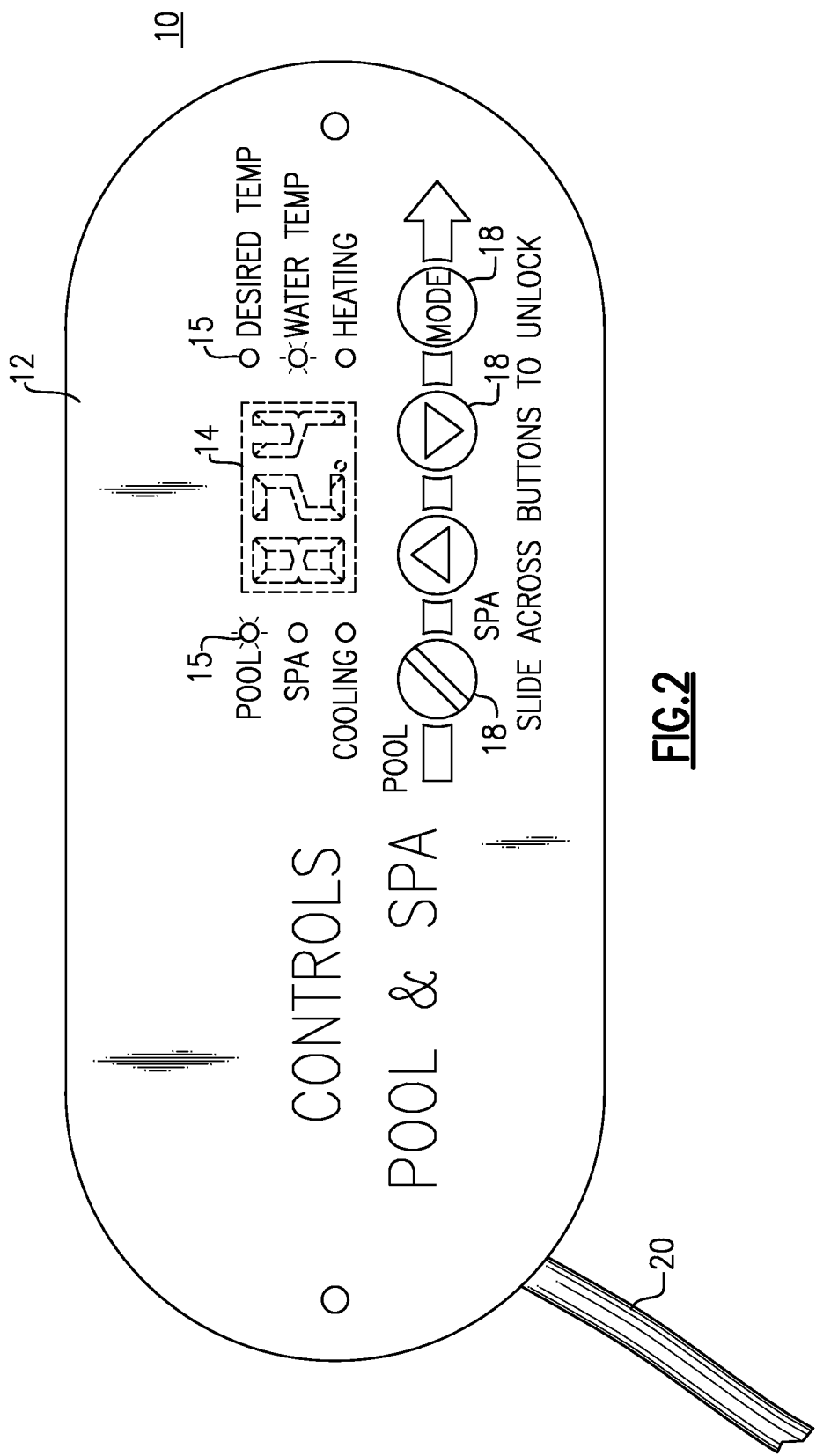
FIG. 2 is a is a front view thereof, shown with the control panel in an active mode.

FIG. 2 shows control panel 10 with the front panel 12 in an unlocked or active condition, i.e., ready for changing temperature settings for the pool or the spa. Here, an alpha-numeric display is now visible through a transparent window 14 formed in the front panel 12, and a pair of indicator LEDs 15 are lit and visible through the front panel 12, in this example to indicate that the display relates to the actual water temperature of the pool, here displayed as 82.4 degrees F. Touching the pool/spa icon 18 will toggle the control between pool and spa, and will change the display from pool to the spa or hot-tub water temperature. The mode select icon is used for scrolling between cooling, heating, desired water temperature, i.e. setpoint, and actual water temperature. The temperature up and temperature down icons are used for changing the heating and cooling setpoints for the pool and for the spa. These icons may also have other functions, depending on the application. When none of the icons have been touched for some predetermined time, e.g., 20 seconds, the control panel will revert to an off state, i.e., a locked or inactive state, and the user will need to swipe past the four icons to re-activate it.

FIGS. 3 and 4, which are an edge view and a rear view, respectively, of this control panel 10, show the front plate 12 with a co-extensive rear plate 22 of the same profile affixed to it, and with an adhesive sheet or adhesive layer 32 between them. A rectangular frame 24 projects back from the rear plate 22 and serves as a potting barrier to contain an encapsulation 26 of a potting compound. The potting compound can be a binary self-curing resin material, which is waterproof and resistant to caustic or corrosive materials and contaminates, sealing up the electronic circuitry for the control panel 10.

Figure 5:
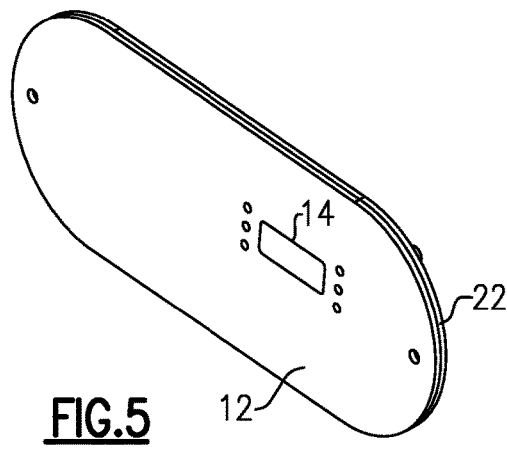
FIG. 5 is a front perspective view thereof.
Figure 6:
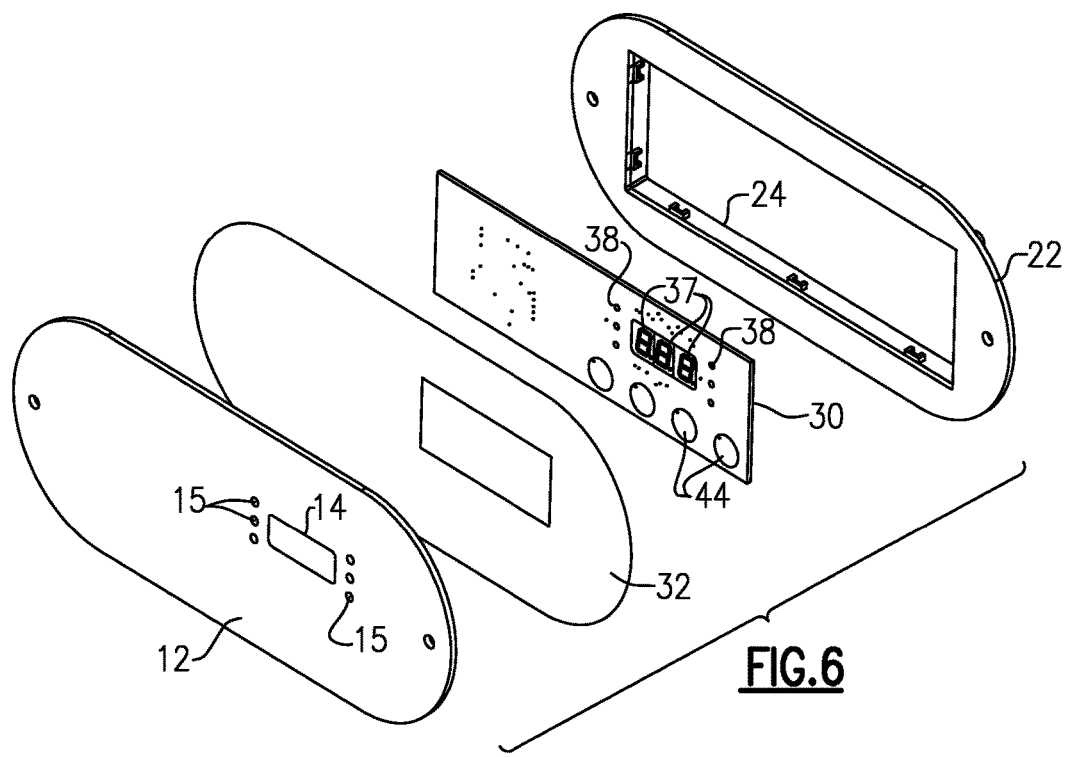
FIG. 6 is an exploded assembly view thereof from the front side.
Figure 7:
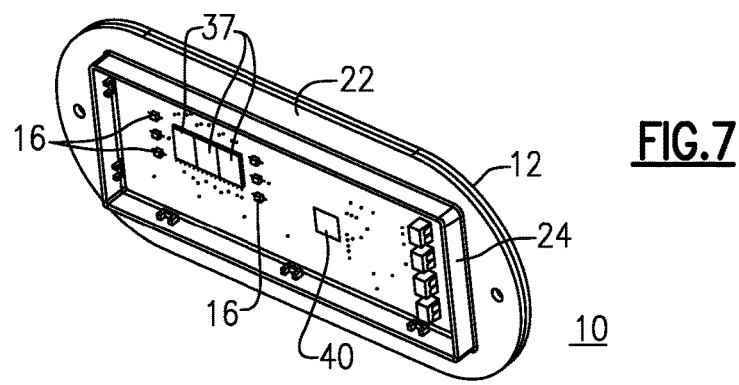
FIG. 7 is a rear perspective view thereof.
Figure 8:
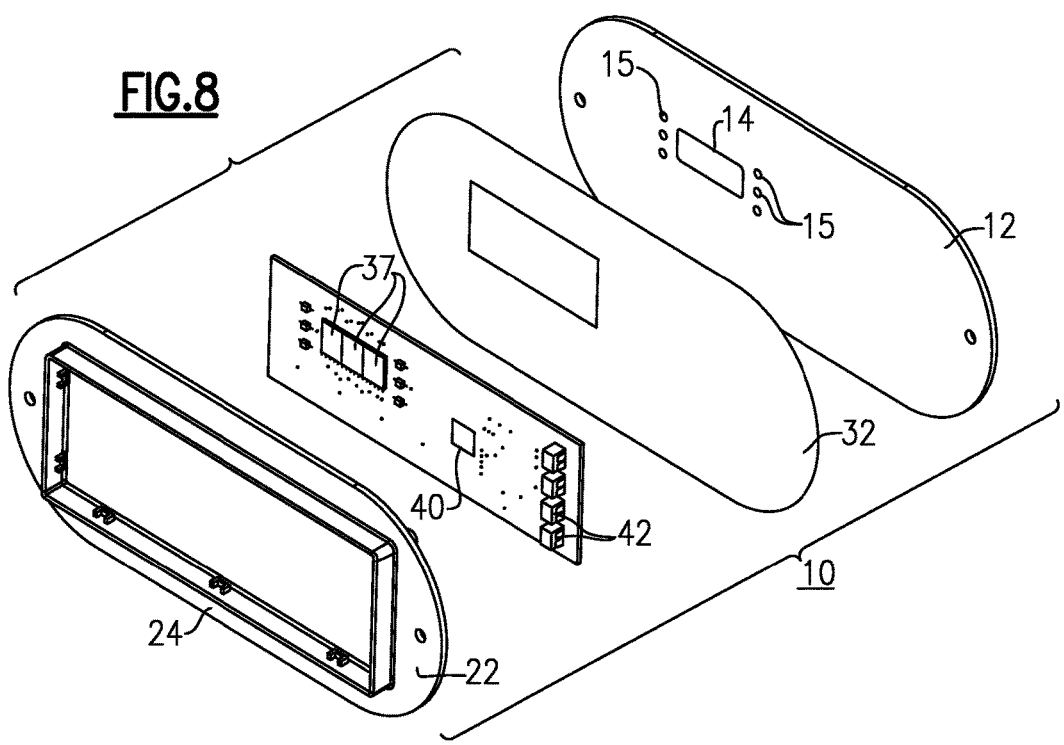
FIG. 8 is a rear exploded assembly view thereof.

The assembly arrangement of the control panel 10 can be explained with reference to FIGS. 5 and 6, which are a front perspective view and front assembly view, and with reference to FIGS. 7 and 8, which are a rear perspective view and rear assembly view, respectively.

These views show the front plate 12 (icons and other graphics being omitted here), the back plate 22 with open rectangular frame 24, and a generally rectangular printed circuit board 30 that fits within the cavity of the frame 24 or potting barrier. The printed circuit board 30 has a flat front surface that faces against the rear surface of the dielectric front panel, and a rear side, which is the side populated with the electronic components. The adhesive member 32 stands between front panel 12 and the printed circuit board 30 to bond the board 30 to the front panel 12, and also to bond the back plate 22 to the front panel 12. A rectangular void in the adhesive member 32 ensures a clear zone at the location of the aforesaid window 14 and also at positions of small windows 15 for the indicator LEDs 16. As shown in FIGS. 6 and 8, there are a row of alphanumeric display modules 37 located at one or more cutouts or windows 36 on the printed circuit board, and these modules 36 are oriented face-down on the populated or rear side of the board, so that the numerals or letters when displayed are visible at the front or flat side of the board and are visible through the window 14. Likewise, there are openings or holes 38 through the printed circuit board 30 and present at locations of the indicator LEDs 16, so that the indicator LEDs, which are on the reverse or component side of the board, will shine through the openings or holes 38 and will be visible, when lit, through the front plate 12. A cap or cover (not shown) may be cemented over the module(s) 36 on the reverse side of the board prior to encapsulation or potting to exclude the potting resin from the display device(s), similar to what is shown and discussed below in the following embodiment (FIGS. 15 to 19).

A microprocessor 40 is mounted on the rear or component side of the board 30 as are a series of connectors 42, which permit connection to the conductors of the multi-conductor cable 20. On the flat front side of the circuit board 30 there are a series or row of metallized discs 44 that serve as the capacitive electrodes for the icons 18 discussed earlier. These metallized discs 44 are connected by vias through the board to conductive traces on the component side of the board, and thence to the microprocessor 40. The presence of the operator's finger at the icon, and at the position on the dielectric material of the front plate 12 that is directly opposite the respective disk 44, will affect the capacitance that is seen by the microprocessor, and this allows the microprocessor to change the mode or setting of the associated pool and spa heater or heat pump.

Figure 9:
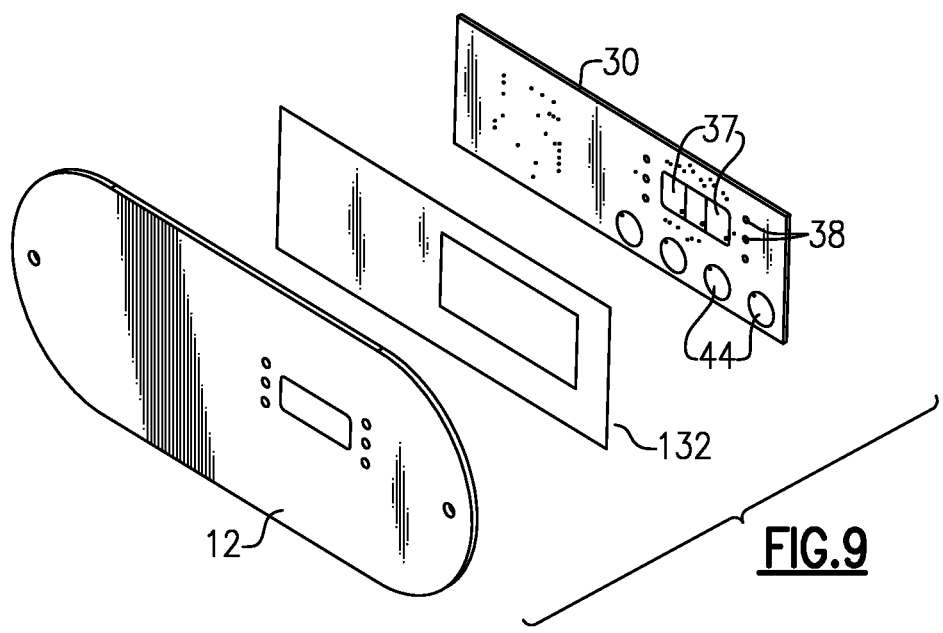
FIG. 9 is a front assembly view of an alternative embodiment.
Figure 10:
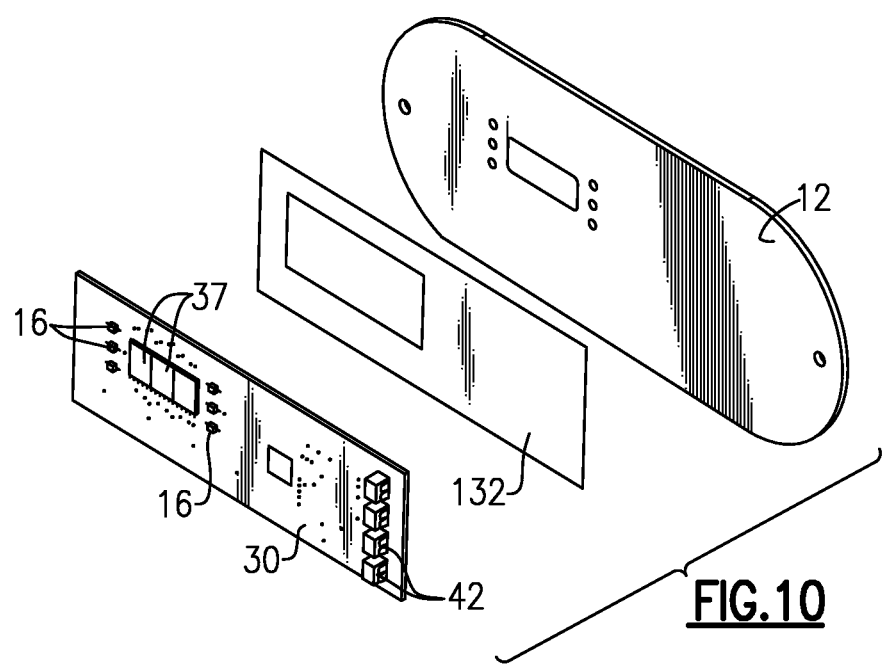
FIG. 10 is a rear assembly view thereof.

FIGS. 9 and 10 are front and rear assembly views of another embodiment, in which the rear plate 22 and the potting compound 26 are omitted, i.e., where the panel 10 would be employed in an environment where caustic or corrosive chemicals would not be present. In this case, a rectangular adhesive member 132 has the same profile as the printed circuit board 30 and adheres or bonds the board to the rear side of the front plate 12. Otherwise, the construction and operation of the control board would be basically the same as in the first-described embodiment.

Figure 11:
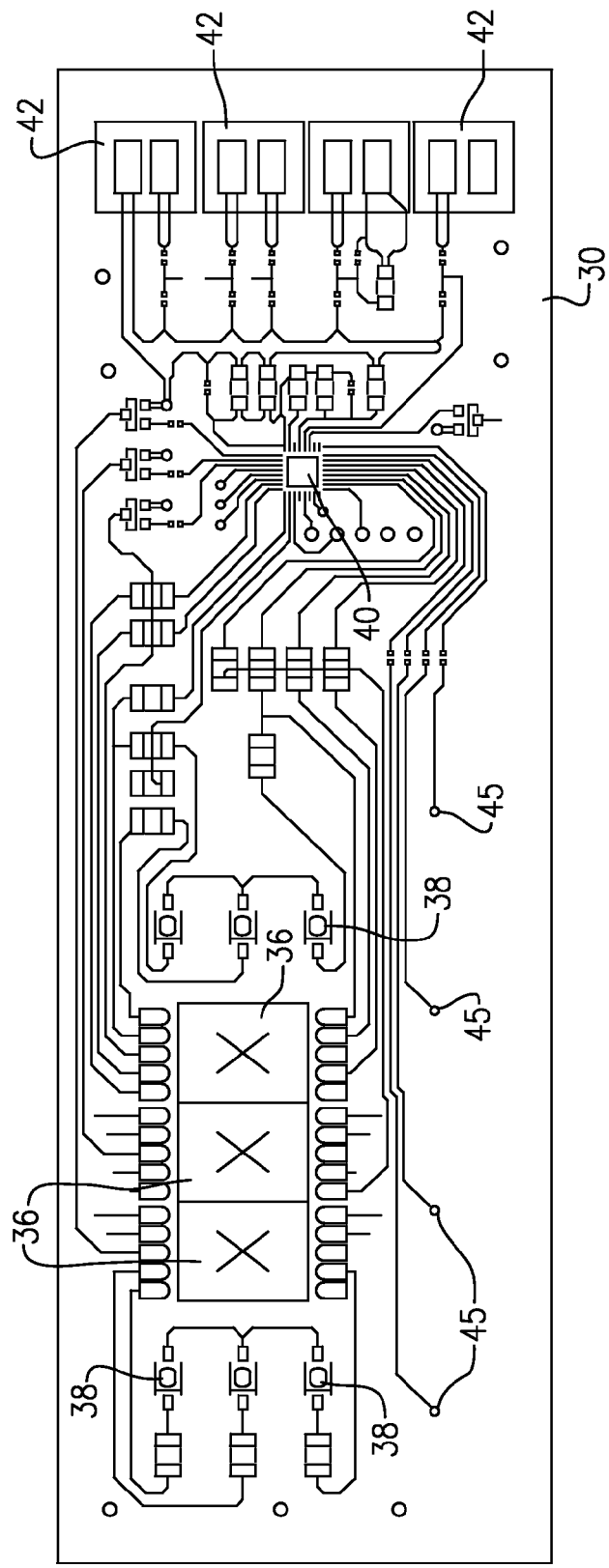
FIG. 11 is a plan view of the rear or component side of the printed circuit board employed in the foregoing embodiments.
Figure 12:
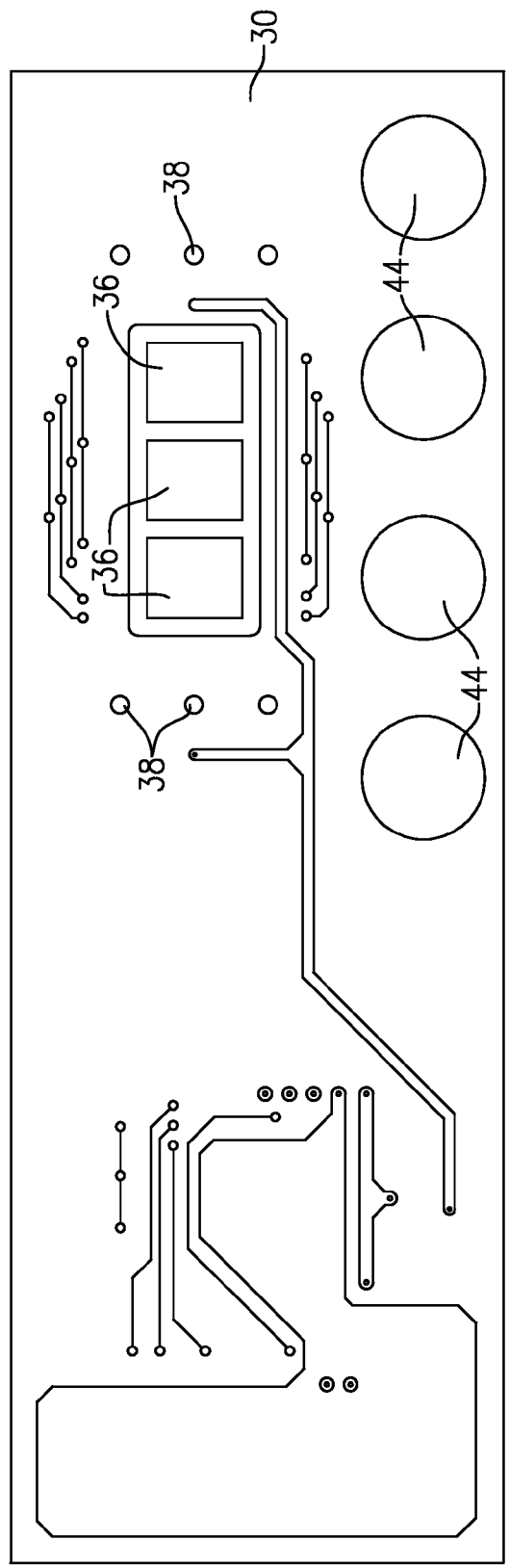
FIG. 12 is a plan view of the front side of the printed circuit board of FIG. 11.

The printed circuit board 30 is shown in more detail in FIGS. 11 and 12, respectively showing the component or back side of the board 30, and the flat front side. FIG. 11 shows positions of through hole openings 38 where the indicator LEDs 16 are to be mounted, three each on either side of the row of window openings 36 in which the alphanumeric display modules 37 are to be mounted. This view also shows the conductive traces (not numbered) that connect to inputs and outputs of the microprocessor 40, and which also connect with the vias that pass through the board to connect with the metallized disks 44 or capacitive touch sensors (FIG. 12). Additional traces and grounding pads (not numbered) are printed on the front side of the board.

In this embodiment, the conductive pads 44 are printed on the board 30 and the board is secured adhesively against the acrylic (or other dielectric) front panel 12. However, it is possible to construct the control panel of this invention with the capacitive touch screen pads printed on the reverse side of the front panel 12 or an a thin membrane that is adhered to the front panel. In that case compressive connectors, e.g., spring loaded or so-called zebra conductor or elastomeric conductor can connect each of the capacitive touch pads to associated contact pads on the front side of the printed circuit board 30.

Moreover, if a plain or dead-face presentation is desired, rather than having the icons 18 printed or visibly present on the front panel 12, the capacitive touch screen pads 44 can be formed with an etched-away design to permit light to pass, the portion of the circuit board directly behind each of the pads 44 can be made of a translucent or transparent material, and an additional LED or equivalent illumination source can be placed behind that area on the component side of the board. This arrangement can provide a back-lit display of the hidden icons by presenting the illuminated design. The associated additional LEDs are turned on when the touch screen is activated. These may all be turned on together, or if desired only those needed for a given operation, such as for raising or lowering temperature setpoints, may be illuminated, and left off when not active or needed for a given operation. This allows the icons to be illuminated to guide the user. The additional LEDs used for backlighting the icons can be of different colors also, depending on the mode.

Figure 13:
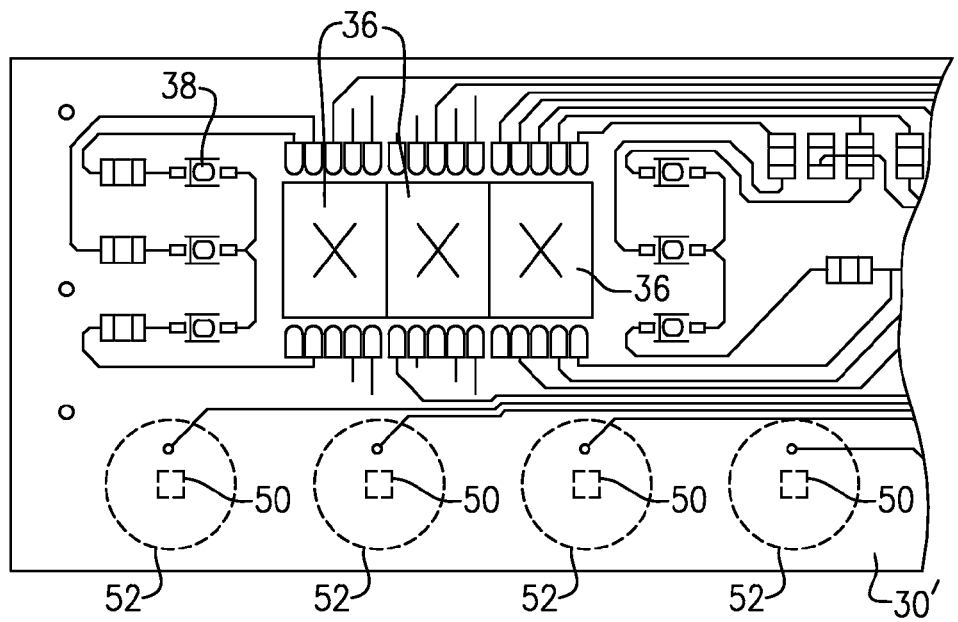
FIGS. 13 and 14 are partial rear and front views of an alternative circuit board for an embodiment of this invention.
Figure 14:
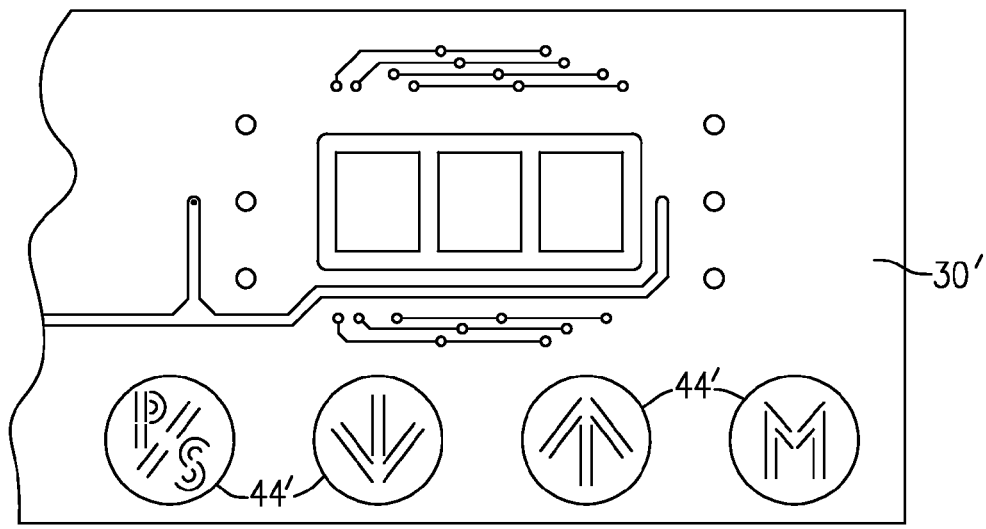

FIGS. 13 and 14 are partial back and front views of an alternative arrangement of the printed circuit board 30' for a blank or "dead-face" control panel, where the icons are back-lighted and appear by illuminating auxiliary LEDs 50 as shown in FIG. 13 and located on the board 30' behind translucent portions 52 that correspond to the positions of the metallized discs 44', to allow the back-lit illumination through. There are slits or apertures formed in the metallized discs 44 that form recognizable icons for pool-spa select, temperature down, temperature up, and mode select. The auxiliary LEDs are lit only when needed, and only when the control panel is activated or unlocked, as discussed above.

Figure 15:
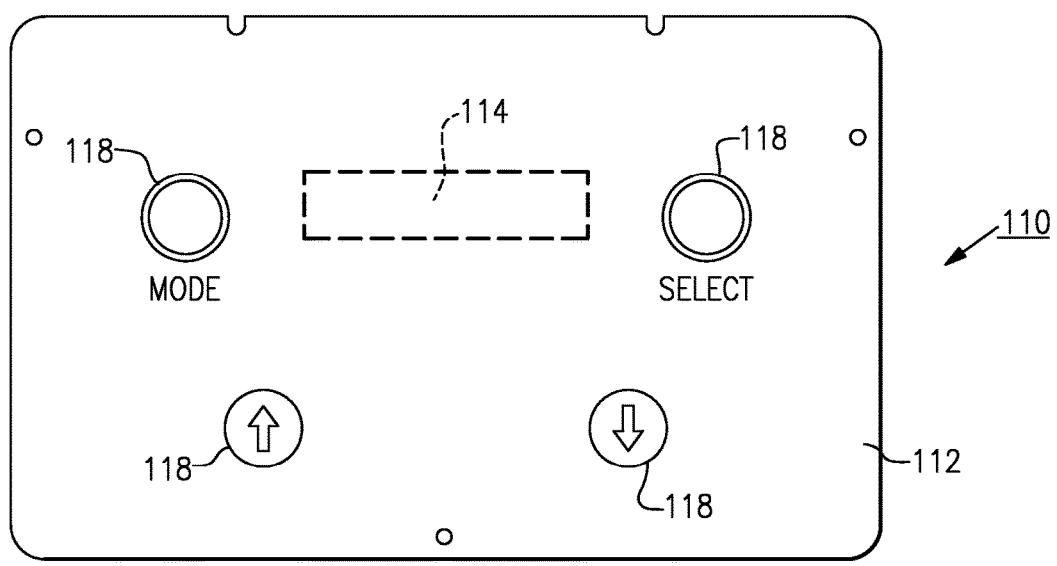
FIG. 15 is a front view of another, alternative embodiment of the touch-screen control panel of this invention.

FIG. 15 illustrates an alternative capacitive touch-screen control panel 110 employing the same principles of this invention, but configured for a different style cabinet or housing and for different equipment. In this case, the control panel 110 is square or rectangular, and has a front plate or panel 112, also formed of a tough dielectric material, e.g., acrylic or carbonate, with a window 114, though which alphanumeric display module(s) and various indicator LEDs can be seen. In this embodiment, there are four round touch-button icons 118, arranged in a pattern that is not a single row. A printed circuit board, not shown here, would have capacitive metallized pads at positions behind these respective icons 118. This control panel can be activated or woken up by touching the icons in some predetermined order, e.g., first the mode icon, then the up-arrow icon, then the down-arrow icon, and then the select icon. Touching the icons 118 in another predetermined order can set the control panel into its rest mode, or this may occur after a period of inactivity, e.g., 20 seconds.

In an outdoor environment, having the control panel revert to an inactive or rest mode will prevent inadvertent changing of settings, for example, when a bird or squirrel touches the front panel 112.

Construction of the control panel 110 can include stacked printed circuit boards, as illustrated in FIGS. 16, 17, 18, and 19.

Figure 17:
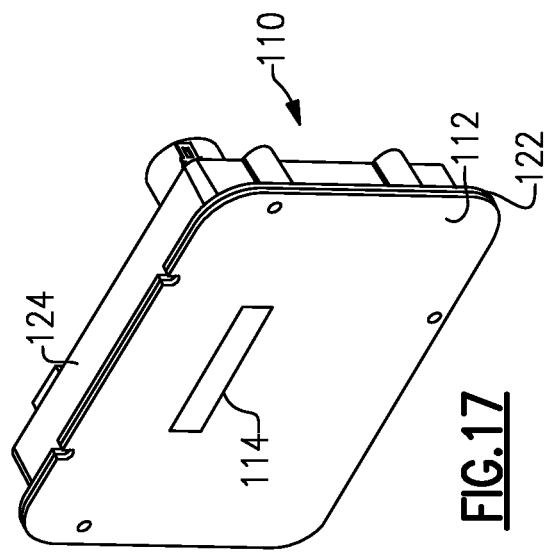
FIGS. 16 and 17 are rear and front perspective views of the touch-screen control panel of this alternative embodiment.
Figure 16:
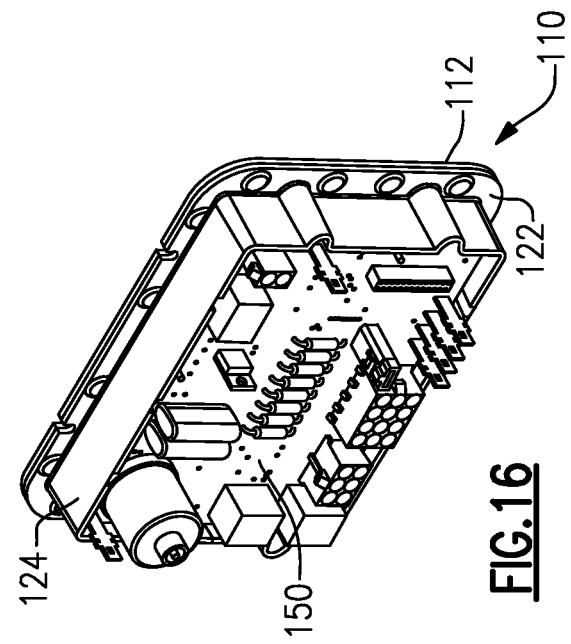
Figure 18:
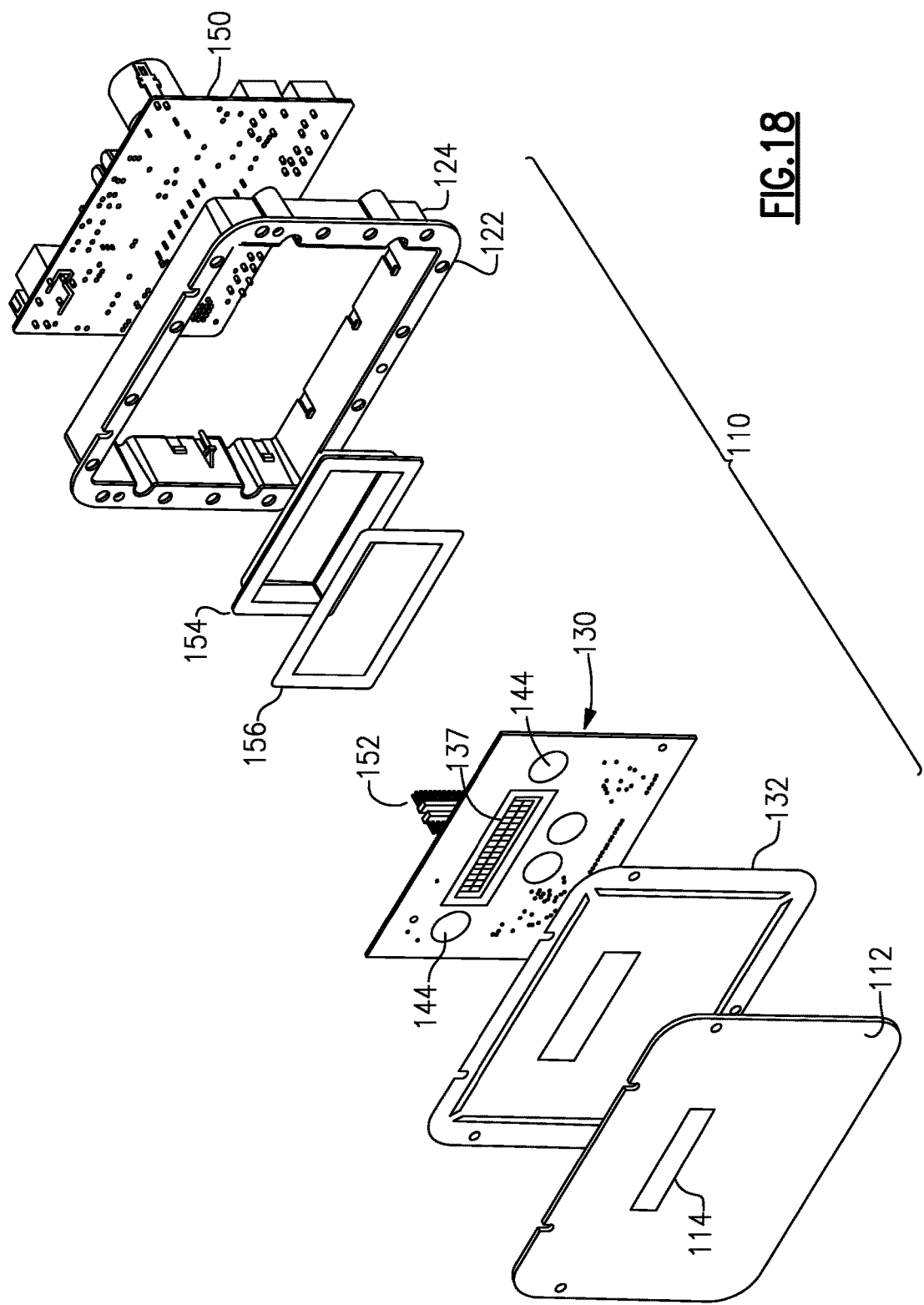
FIGS. 18 and 19 are exploded front and rear assembly views thereof.
Figure 19:
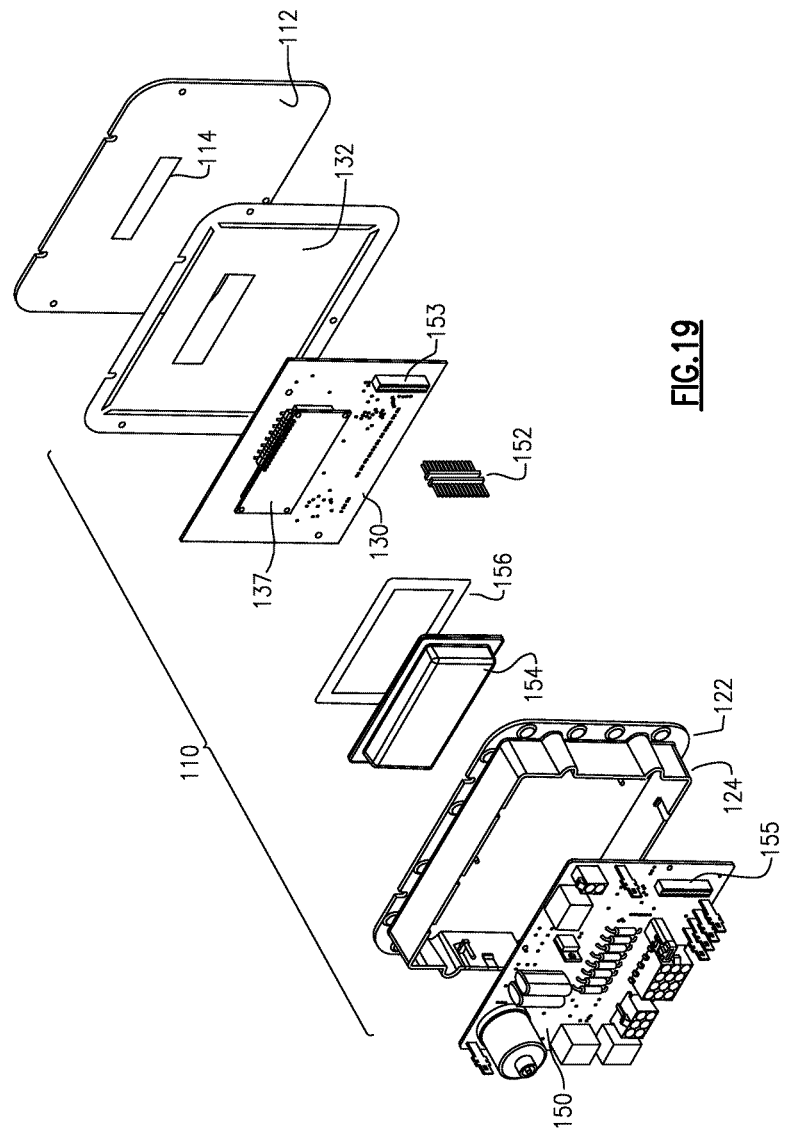

The control panel 110 with stacked circuit boards as illustrated in FIGS. 16 and 17 has a flat front panel 112 with a transparent viewing window area 114, and a rear plate 122 on which a rectangular frame or potting dam 124 extends back or proximally to contain the two (or multiple) circuit boards plus potting compound. As shown in the assembly views of FIGS. 18 and 19, a front printed circuit board 130 has a display unit 137 mounted on the reverse or back side (FIG. 19) and visible through a cutout or window formed in the board 130. A number of metallic electrode disks 144 are printed, screened or otherwise formed on the front side of the first circuit board 130 (FIG. 18). The board 130 is secured by means of an adhesive member 132 to the back side of the front plate 112 so that the display unit 137 is visible through the window area 114. The back frame 122, i.e., the potting barrier, is also secured by the margin of the adhesive member 132 to the outer edge area of the front panel 112. A board-to-board interconnect 152, which here is in the form of an array of double-end pins, is inserted into a connector receptacle 153 on the front circuit board 130, and a plastic cap or cover 154 is placed over the LCD display unit 137 and secured using an adhesive ring 156 to seal out potting resin from the display unit 137. After the potting material has been flowed into the potting frame 124 and onto the components (other than the LCD display) on the board 130, the second or upper printed circuit board 150 is placed within the potting barrier or frame 124. The pins of the interconnect 152 fit into a mating connector on the second circuit board 150, and edges of the board 150 snap into place in mating receptacles or ledges in the walls of the frame or potting dam 124. Then additional potting compound can be flowed onto the printed circuit board 150 to seal all its components hermetically. The potting material, analogous to the potting compound 26 of FIG. 4, is understood to be present in the assembled unit, but is not shown in these drawing figures. In some applications, the potting material may be omitted.

A cable, such as cable 20 discussed earlier, would be present, but is omitted here for sake of simplicity in the Drawing.

The method of construction of this control unit 110 is similar to the previously described control panel 10. The touch interface front plate 112 has the printed circuit board 130 directly adhered to the plate 112 (or alternatively the electrode disks 144 are printed directly on the back of the front plate 112), and the board 130 is placed directly adjacent the front panel 112, and the control electronics are encapsulated in potting resin. The first and second printed circuit boards are interconnected with a board-to-board connector, or alternatively with a wiring harness, or in some cases with an elastomeric flexible connector. Third and further circuit boards may be stacked on these two 130 and 150, for an appropriate application. Channels on the sides of the potting barrier or frame 124 aid in resin flow so that the space within the barrier can be filled completely. The additional boards may be arranged parallel to the first board 130, or may be arranged in a plane or planes perpendicular to the first board 130. In this embodiment, the two circuit boards 130 and 150 are the same dimension so as to both fit into the potting frame, but this would not be necessary in all implementations.

This arrangement doubles (or further multiplies) available area for mounting electronic components, permitting additional features and versatility to be included in the control panel.

The capacitive touch control panel of the embodiments of the present invention can have many applications outside of the pool and spa example given above. The invention is not to be limited only to the embodiments described or suggested. Rather, while the invention has been described with reference to selected preferred embodiments, the invention is not limited to the described embodiment; rather many variations of these would present themselves to persons skilled in the art without departing from the scope and spirit of this invention, as defined in the appended claims.

We claim:

1. Touch-screen control panel interface, comprising
    a generally flat panel formed of a plate of substantially rigid dielectric material having a front face and a back face, and which has a transparent window portion formed therein;
    a principal circuit board having a front side and a reverse side, the reverse side being a component side on which circuit elements are mounted, and the front side being flat and without components thereon, the principal circuit board including at least one numeric or alphanumeric display module mounted on the reverse side of the principal circuit board, and the at least one numeric or alphanumeric display module having a visible display on a front face thereof; the principal circuit board having a window cutout at the position where the at least one numeric or alphanumeric display is mounted, the at least one display module being oriented with its front face towards the principal circuit board such that its visible display is situated within said window cutout at the front side of the principal circuit board;
    a plurality of indicator LEDs mounted on the reverse side of the circuit board at predetermined LED locations thereon; said printed circuit board having apertures formed at said predetermined LED locations such that when energized said indicator LEDs emit light through the respective apertures to be visible at the front side of the principal circuit board;
    a plurality of metallized capacitive electrode pads formed at predetermined respective locations on the flat front side of the principal circuit board;
    a microprocessor mounted on the reverse side of said principal circuit board and having a plurality of input electrodes and output electrodes;
    an array of conductors on said principal circuit board connecting at least some of the input electrodes and output electrodes of the microprocessor to said at least one numeric or alphanumeric display module, to said indicator LEDs, and to said plurality of metallized capacitive electrode pads on the front side thereof respectively;
    a multi-conductor cable connected with said array of conductors, and extending from said principal circuit board and adapted to connect to a control component associated with said interface; and
    an adhesive member sandwiched between said circuit board and said flat panel such that the flat front side of the principal circuit board substantially abuts the back face of said flat panel and is affixed thereto.

2. Touch screen control panel interface according to claim 1, wherein said generally flat panel is formed of a sheet of rigid generally transparent dielectric material.

3. Touch screen control panel interface according to claim 1, wherein a plurality of touch button icons are printed onto the back surface of said generally flat panel, and are configured to align in registry with said plurality of metallized capacitive electrode pads on said principal circuit board.

4. Touch screen control panel interface according to claim 1, wherein said generally flat panel is gently curved around one or more axes.

5. Touch screen control panel interface comprising
    a generally flat panel formed of a plate of substantially rigid dielectric material having a front face and a back face, and which has a transparent window portion formed therein;
    a principal circuit board having a front side and a reverse side, the reverse side being a component side on which circuit elements are mounted, and the front side being flat and without components thereon, the principal circuit board including at least one numeric or alphanumeric display module mounted on the reverse side of the principal circuit board, and the at least one numeric or alphanumeric display module having a visible display on a front face thereof; the principal circuit board having a window cutout at the position where the at least one numeric or alphanumeric display is mounted, the at least one display module being oriented with its front face towards the principal circuit board such that its visible display is situated within said window cutout at the front side of the principal circuit board;
    a plurality of indicator LEDs mounted on the reverse side of the principal circuit board at predetermined LED locations thereon; said principal circuit board having apertures formed at said predetermined LED locations such that when energized said indicator LEDs emit light through the respective apertures to be visible at the front side of the principal circuit board;
    a plurality of metallized capacitive electrode pads formed at predetermined respective locations on the flat front side of the principal circuit board;
    a microprocessor mounted on the reverse side of said principal circuit board and having a plurality of input electrodes and output electrodes;
    an array of conductors on said principal circuit board connecting at least some of the input electrodes and output electrodes of the microprocessor to said at least one numeric or alphanumeric display module, to said indicator LEDs, and to said plurality of metallized capacitive electrode pads on the front side thereof respectively,
    a multi-conductor cable connected with said array of conductors extending from said principal circuit board and adapted to connect to a control component associated with said interface;
    an adhesive member sandwiched between said principal circuit board and said flat panel such that the flat front side of the principal circuit board substantially abuts the back face of said flat panel and is affixed thereto: and
    further comprising a back plate dimensioned and configured to be adhered to said flat panel, having a cutout dimensioned to fit around said principal circuit board when the principal circuit board is adhered to said flat panel; and having a potting frame at the periphery of said cutout extending back from the back side of the back plate, the potting frame being at least coextensive with said principal circuit board.

6. Touch screen control panel interface according to claim 5, further including an encapsulation of a synthetic resin potting material filling said frame and hermetically sealing the principal circuit board within the touch screen control panel interface.

7. Touch screen control panel interface according to claim 6, further comprising a second circuit board mounted within said potting frame proximally of said principal circuit board.

8. Touch screen control panel interface according to claim 7, further comprising a board-to-board interconnector connected at one side to said principal circuit board and at the other end to said second circuit board.

9. Touch screen control panel interface according to claim 6, further comprising a preformed protective cap member adapted to fit over said at least one numeric or alphanumeric display, said protective cap member having a peripheral flange, and an adhesive member bonding the peripheral flange of said protective cap to said principal circuit board to keep out the potting material from said at least one numeric or alphanumeric display.

10. Touch screen control panel interface according to claim 1, wherein said window portion of said flat panel is configured to be in registry with said at least one numeric or alphanumeric display module when the principal circuit board is affixed in place onto said flat panel.

11. Touch screen control panel interface according to claim 1, further comprising a plurality of LEDs positioned on the reverse side of said principal circuit board at locations in registry with the respective capacitive electrode pads, said board and said capacitive electrode pads being at least partly translucent or transparent at the locations of said LEDs; and wherein said microprocessor is operative to illuminate the respective LEDs when said touch-screen control panel interface is in an active condition and to hold the LEDs off when the touch-screen control panel interface is in an inactive condition.

12. Touch screen control panel interface according to claim 1, wherein said plurality of metallized capacitive electrode pads are arranged in a row on said principal circuit board and said microprocessor is suitably programmed to switch the touch screen control panel interface into an inactive condition after a predetermined time delay, and to switch the touch screen control panel interface into an active condition when the microprocessor detects that the capacitance on said electrode pads has changed in row order to indicate a swipe past the row of said capacitive electrode pads.

13. Touch screen control panel interface according to claim 1, wherein said plurality of metallized capacitive electrode pads are arranged in a predetermined pattern on said principal circuit board and said microprocessor is suitably programmed to switch the touch screen control panel interface into an inactive condition after a predetermined time delay, and to switch the touch screen control panel interface into an active condition when the microprocessor detects that the capacitance on said electrode pads has changed in a predetermined order of the pattern of said capacitive electrode pads.

* * * * *